United States Patent
Wang et al.

(10) Patent No.: US 6,201,273 B1
(45) Date of Patent: Mar. 13, 2001

(54) STRUCTURE FOR A DOUBLE WALL TUB SHAPED CAPACITOR

(75) Inventors: Chen-Jong Wang; Mong-Song Liang, both of Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/225,668

(22) Filed: Jan. 5, 1999

Related U.S. Application Data

(62) Division of application No. 08/598,784, filed on Feb. 8, 1996, now Pat. No. 5,856,220.

(51) Int. Cl.[7] .................................................. H01L 27/108
(52) U.S. Cl. ........................................... 257/306; 257/309
(58) Field of Search ..................................... 257/309, 306

(56) References Cited

U.S. PATENT DOCUMENTS

| | | | | |
|---|---|---|---|---|
| 5,072,270 | * | 12/1991 | Nishimura | 257/306 |
| 5,084,405 | * | 1/1992 | Fazan et al. | 438/253 |
| 5,266,513 | | 11/1993 | Fazan et al. | 437/52 |
| 5,334,869 | * | 8/1994 | Iguchi et al. | 257/306 |
| 5,364,809 | | 11/1994 | Kwon et al. | 437/52 |
| 5,451,539 | | 9/1995 | Ryou | 437/60 |
| 5,856,220 | * | 1/1999 | Wang et al. | 438/254 |
| 5,952,687 | * | 9/1999 | Kawahubo et al. | 257/309 |

* cited by examiner

*Primary Examiner*—Mark V. Prenty
(74) *Attorney, Agent, or Firm*—George O. Saile; Stephen B. Ackerman; William J. Stoffel

(57) ABSTRACT

A method and structure is described for a DRAM cell having a double wall tub shaped capacitor. The structure of the capacitor has two embodiments: a double wall tub shaped capacitor and a double wall cup shaped capacitor. In a first embodiment for the tub shaped capacitor, the method comprises using two masks to form a tub shaped hole partial through an insulating layer and a concentric contact hole over the source. A polysilicon layer is formed over the insulating layer. Oxide spacers are formed on the sidewalls of the tub shaped hole. The polysilicon layer is patterned to separate adjacent electrodes. Next, a polysilicon inner wall is formed on the spacer sidewalls. The oxide spacers are then removed. The dielectric and top electrode are formed next thus completing the double wall tub shaped capacitor. The second embodiment for forming the cup shaped capacitor comprises forming an insulating layer the substrate surface and forming a photoresist layer with an opening over a source region. The insulating layer is isotropically etched through the opening to form a cup shaped cavity. Next, the insulating layer is anisotropically etch through the opening to form a contact opening exposing the source. A polysilicon layer is formed filling the contact hole and the cup shaped cavity. Oxide and polysilicon spacers are sequentially formed on the sidewalls of the cylindrical hole. The insulating layer and oxide spacers are then removed. A capacitor dielectric and a top electrode are formed over the storage electrode to complete the double wall cup shaped capacitor.

10 Claims, 9 Drawing Sheets

US 6,201,273 B1

STRUCTURE FOR A DOUBLE WALL TUB SHAPED CAPACITOR

This is a divisional patent application Ser. No. 08/598,784, filing date Feb. 8, 1996, titled: A Structure And A Method For Fabricating A Double Wall Tub Shaped Capacitor, assigned to the same assignee as the present invention now U.S. Pat. No. 5,856,220.

BACKGROUND OF INVENTION

1) Field of the Invention

This invention relates generally to the fabrication of capacitors in dynamic random access memory (DRAM) cells and more particularly to a structure and a method for fabricating capacitors with a large capacitance.

2) Description of the Prior Art

In dynamic semiconductor memory storage devices it is essential that storage node capacitor cell plates be large enough to retain an adequate voltage level in spite of parasitic capacitances and noise that may be present during circuit operation. As is the case for most semiconductor integrated circuitry, circuit density is continuing to increase at a fairly constant rate. The issue of maintaining storage node capacities is particularly important as the density of DRAM cells continues to increase for future generations of memory devices. The ability to densely pack storage cells while maintaining required storage capabilities is a crucial requirement of semiconductor manufacturing technologies if future generations of expanded memory array devices are to be successfully manufactured.

The array of storage cells on a dynamic random access memory (DRAM) chip is one circuit element experiencing electrical limitations. These individual DRAM storage cells, usually consisting of a single metal-oxide-semiconductor field-effect-transistor (MOSFET) and a single capacitor are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of the memory cell as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors. In order to increase the surface area of the capacitor, there have also been proposed methods of forming a capacitor with a pin structure extending throughout a multi-layer structure of the capacitor to connect the layers with one another and a method of forming a capacitor using a hemispherical grain polysilicon (HSG) process using polysilicon grains.

Workers in the art are aware of the limitation of capacitors and have attempted to resolve them. U.S. Pat. No. 5,364,809 (Kwon et al.) teaches a method of fabricating a multi-chamber type capacitor. A stacked capacitor having a concave area is formed and then oxide spacers are formed in the concave area. U.S. Pat. No. 5,266,513 (Frazan et al.) teaches a method to form a stacked multi-fingered cell capacitor and extension over an adjacent cell. U.S. Pat. No. 5,451,539 (Ryou) teaches a method of forming a double wall cylindrical capacitor. Ryou forms the two upright walls as spacers on an oxide cylinder. However, many of the prior art methods require substantially more processing steps or/and planar structures that make the manufacturing process more complex and costly. Therefore, it is very desirable to develop processes that are as simple as possible and maximize the capacitance per unit area. There is a challenge to develop methods of manufacturing these capacitors that minimize the manufacturing costs and maximize the device yields. In particular, there is a challenge to develop a method which minimizes the number of photoresist masking operations and provides maximum process tolerance to maximize product yields.

SUMMARY OF THE INVENTION

It is an object of the present invention to provide methods for fabricating double wall tub or cup shaped capacitors which have less photolithographic and etch steps than the conventional processes.

It is an object of the present invention to provide methods for fabricating (DRAM) having double wall tub and cup shaped capacitors with a high density and capacitance.

It is another object of the present invention to provide structures for double wall tub and cup shaped capacitors with a high density and capacitance.

To accomplish the above objectives, the present invention provides two structures and methods of making a double wall capacitor for a dynamic random access memory (DRAM). The first embodiment provides a double square wall tub structured capacitor (right angled outer wall) and the second embodiment provides a double wall cup shaped capacitor (curved outer wall). The first embodiment uses only three photo masks to form the double wall capacitor having an outer cylinder with a right angle bend. The second embodiment uses only two photo masks to form a double wall capacitor with a curved outer cylinder.

In the first embodiment for a tub structured capacitor, the method uses a mask to form a tub shaped hole partial through an insulating layer and another mask to form a concentric contact hole over the source. A polysilicon layer is formed in the tub shaped hole and contact hole. Oxide and polysilicon spacers are sequentially formed on the sidewalls of the polysilicon layer. A third mask is used to remove the polysilicon between adjacent electrodes. The oxide spacers are then removed. The dielectric layer and top electrode are formed next thus completing the double wall tub shaped capacitor.

In slightly more detail, the first embodiment provides a method of fabricating a capacitor having a double wall tub shaped storage electrode (with a right angled base) for a memory device on a substrate. The substrate has a device area with a source region formed therein. A first insulating layer composed of silicon oxide is formed on a device area and elsewhere over the substrate. The first insulating layer is patterned to form a contact hole to partially expose the source region. An upper portion of the first insulation layer centered around the contact hole is removed to form a tub shaped hole centered over the contact hole. The cup hole has vertical sidewalls and a horizontal bottom. A first conductive layer composed of polysilicon is formed over the first insulating layer, in the cup hole, and in the contact hole. The first conductive layer has vertical sidewalls on the vertical sidewalls of the cup hole. Subsequently oxide spacers are formed over the vertical sidewalls of the cylindrical storage electrode. Next, the first conductive layer is patterned to separate adjacent storage electrodes. A vertical inner wall of polysilicon is then formed on the vertical sidewalls of the spacers. The spacers and the first insulation layer are removed forming a the double wall tub shaped storage electrode aligned to the device area. A capacitor dielectric layer and a top electrode are formed over at least the storage electrode thereby forming the double wall tub shaped capacitor.

The second embodiment for forming a double wall cup shaped capacitor comprises forming a first insulating layer composed of silicon oxide the device area and over a substrate. A first photo resist layer is formed having a first opening over a source region. Optionally, the first insulation layer is anisotropically etched an adjustable depth. Then, the first insulation layer is isotropically etched through the first opening forming a cup shaped hole. The cup shaped hole has an adjustable shape which is affected by the previous optional anisotropic etch. The first insulating layer is anisotropically etched through the first opening forming a contact hole to partially expose the source. The photoresist layer is then removed. A conformal first conductive layer composed of polysilicon is formed over the first insulating layer, in the cup shaped hole and in the contact hole. The first conductive layer has curved sidewalls on the curved sidewalls of the cup shaped hole. Insulating spacers are formed over the arced sidewalls of the first conductive layer. The first conductive layer is patterned forming a cup shaped electrode aligned to the device area. A vertical inner wall of polysilicon is formed on the sidewalls of the spacers. The spacers and first insulating layer are removed thereby forming the double wall cup shaped storage electrode. A capacitor dielectric layer and a top electrode are sequentially formed over the at least the storage electrode thereby completing the double wall cup shaped capacitor.

The methods of the current invention provide simple manufacturing to produce a double wall tub and cup shaped capacitors having from 220 to 250% more capacitor cell area than a convention single stacked capacitor. The inner walls are produced using either the same number or fewer masking steps than the conventional stacked capacitor.

DETAILED DESCRIPTION OF THE PREFERRED EMBODIMENTS

The present invention will be described in detail with reference to the accompanying drawings. The present invention provides a method of forming a DRAM having a double wall tub and cup shaped capacitor which has small dimensions, high capacitance and is simple to manufacture. There are two embodiments of the present method. FIGS. 1 through 7 show the first embodiment where the outer wall (cylinder) of the storage electrode has about a right angle between a horizontal lower section 56B and a vertical wall 56A. See FIG. 16. FIGS. 9 through 15 show a second embodiment where the outer cylinder has a cup (curved) shape 82A. See FIG. 17. First, the process for forming the field oxide (FOX) and the field effect transistor structure as presently practiced in manufacturing DRAM cells is only briefly described in order to better understand the current invention. Following that, the first and second embodiments of the method to fabricate the tub and cup shaped capacitors will be described in detail.

Figure 1:
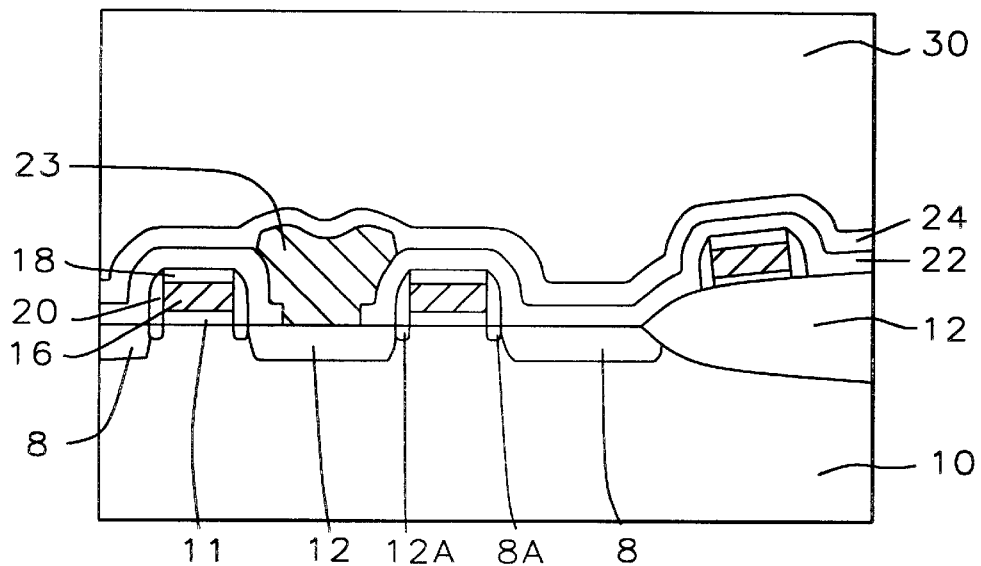
FIGS. 1 through 7 are cross sectional views for illustrating a first embodiment of the method for manufacturing a DRAM having a double wall tub shaped capacitor according to the present invention.

As shown in FIG. 1, the method begins by fabricating a capacitor in a substrate having a field oxide layer 12 and FET devices formed thereon. Field oxide layer 12 is formed on a semiconductor substrate 10 for defining active regions and isolation regions. The preferred substrate is composed of a P-type single crystal silicon having a (100) crystallographic orientation. The term "substrate" is meant to include devices formed within a semiconductor wafer and the layers overlying the wafer. The term "substrate surface" is meant to include the upper most exposed layers on a semiconductor wafer, such as a silicon surface, an insulating layer and metallurgy lines. A relatively thick field oxide (FOX) 12 is formed around the active device areas to electrically isolate these areas. One method of forming these regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions. The preferred thickness of the field oxide is preferably in the range between about 3000 and 7000 Å.

An optional channel stop implant (not shown) can be formed either before or after FOX 12 formation by ion implanting boron at a concentration of between about 2E12 and 5E13 atoms/cm$^2$ and at an energy between about 120 and 180 keV.

The semiconductor FET device is then formed in the active device area. The most commonly used device for dynamic random access memory (DRAM) is metal oxide semiconductor field effect transistor (MOSFET). The formation of the field effect transistors shown in FIG. 1 will be described next. A gate oxide layer 11 is formed, typically by thermal oxidation of the silicon substrate, with a thickness between about 80 and 160 Å. An appropriately doped polysilicon layer and an insulating layer are deposited on substrate 10 and conventional photolithographic techniques are used to pattern these layers to form the gate electrodes 11 16 18. As shown in FIG. 1, the gate electrodes are formed on the substrate disposed between the field oxide regions 12. The gate on the substrate forms the gate electrode of the MOSFET in the active device areas. The gate electrodes formed over the field oxide 12 form word lines that electrically connect the MOSFET gate electrode to the appropriate peripheral circuits on the DRAM chip. The lightly doped source/drains 8A 12A of the N-channel MOSFET are formed next, usually by implanting an N-type atomic species such as arsenic or phosphorus through the spaces between the gate electrodes 11 16 18. For example, a typical implant might consist of phosphorus P31 at a dose of between about 1E13 to 1E14 atoms/cm$^2$ and at an energy between about 30 to 80 Kev.

After forming the lightly doped source/drains 8A 12A, sidewall spacers 20 are formed on the gate electrode 11 16 18 sidewalls. These sidewall spacers 20 are preferably formed by depositing a low temperature silicon oxide and anisotropically etching back to the silicon surface. For example, the silicon oxide could be formed by a chemical vapor deposition using tetraethoxysilane (TEOS) at a temperature in the range of about 650° to 900° C. and the etch back performed in a low pressure reactive ion etcher with a fluorine gas, such as $C_2F_6$ (carbon hexafluoride) or $CF_4+H_2$ (carbon tetrafluoride and hydrogen).

The source 8/drain 12 regions of the MOSFET are now implanted between the spacers with a N type atomic species, for example, arsenic (As75), to complete the source/drain 8 12 (i.e., the source 8 is the node contact). The implantation is usually done through a thin layer of silicon oxide of about 200 to 300 Å in thickness to minimize implant channeling and to protect against contamination by metals and other impurities. A typical implantation dose being between 2E15 to 1E16 atoms/cm$^2$ and an energy of between about 20 to 70 Kev.

As shown in FIG. 1, a first conformal insulation layer 22 is formed over the substrate surface and contacts the source and drain areas 8 12. The conformal insulating layer 22 can be formed of silicon nitride and silicon oxide. The conformal insulating layer 22 is preferably composed of a silicon oxide. Layer 22 preferably has a thickness in the range between about 500 and 3000 Å and more preferably about 1500 Å.

A bit line 23 is then formed by opening up bit line contact opening to the drain 12 and by patterning a conductive layer. The bit line 23 is preferably formed of a tungsten silicide layer over a doped polysilicon layer. The tungsten silicide layer preferably has a thickness in the range of between about 500 and 2500 Å. The doped polysilicon layer preferably has a thickness in the range of between about 500 and 2000 Å.

As shown in FIG. 1, a second conformal insulation layer 24 (i.e., etch barrier layer) is formed over the bit line 23 and the first conformal layer 22. The conformal insulating layer 24 is preferably formed of silicon nitride. Layer 24 preferably has a thickness in the range between about 500 and 3000 Å and more preferably about 1500 Å.

Still referring to FIG. 1, a first insulating layer 30 is formed over the second conformal layer 24. The first insulating layer 30 can be formed of an undoped or doped silicon oxide such as PSG (phosphosilicate glass), Boron-doped silicon oxide, and borophosphosilicate glass (BPSG). The first insulating layer 30 is preferably formed of BPSG formed by a chemical vapor deposition (CVD) process. The first insulating layer 30 preferably has a thickness in the range of between about 10,000 and 20,000 Å and more preferably about 15,000 Å. The thickness of layer 30 in part determines the height of the storage electrode, which effects the cell's capacitance.

The remainder of this description relates more specifically to those objects of the invention, which relate to the formation of the double wall tub shaped storage capacitor having a smaller size, an increased capacitance, and also providing a more manufacturable process. The first embodiment is described next and is shown in FIGS. 1 through 8.

Figure 2:
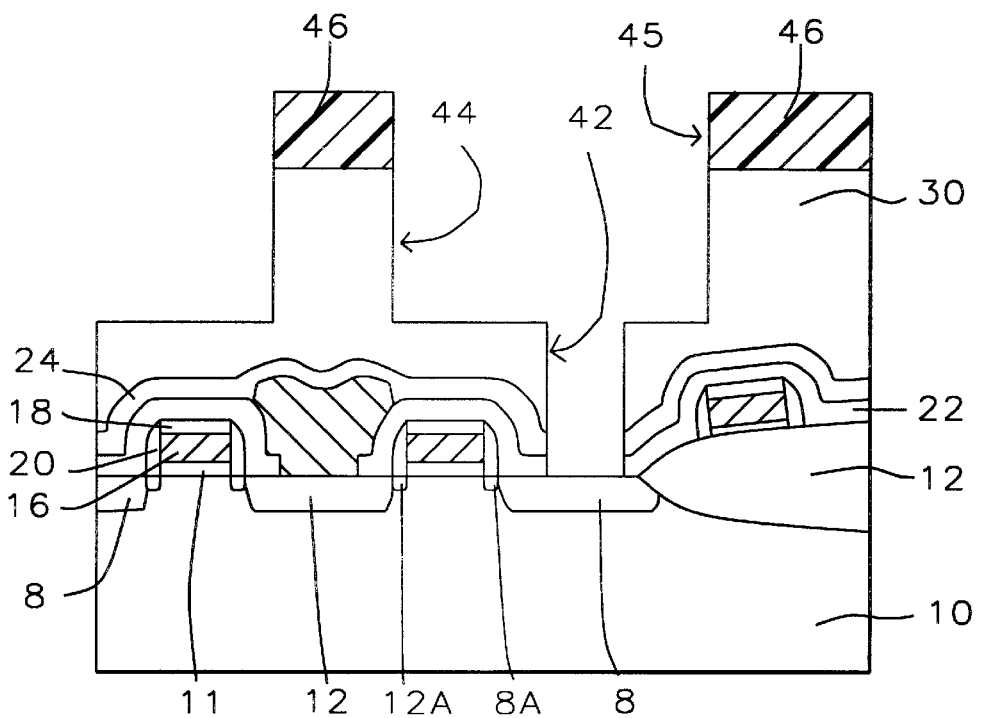

As shown in FIG. 2, a contact hole 42 at least partially exposing the source 8 is formed through the first insulation layer 30 and the underlying layers. The contact hole 42 is formed using conventional lithography—etching techniques. The contact hole preferably has a circular shape with a diameter in the range of between about 0.25 and 0.7 $\mu$m and more preferably about 0.5 $\mu$m.

Referring to FIG. 2, a tub shaped hole 44 (tub hole) is formed centered over the contact hole 42. The tub hole 44 is formed by removing an upper portion of the first insulation layer centered around the contact hole. The tub hole 44 has about vertical sidewalls and a horizontal bottom. The tub hole can be made by forming a first photoresist layer 46 having a first opening 45 centered over the source region 8. The first opening 45 defines the area for the formation of the cylindrical storage electrode. Next, the first insulating layer 30 is anisotropically etched through the first opening 45 removing an upper portion of the first insulating layer. The first opening 45 preferably has a circular or rectangular shape. The first opening is more preferably circular shaped with a diameter in the range of between about 0.5 and 1.0 $\mu$m. The photo resist layer 46 is then removed.

Figure 3:
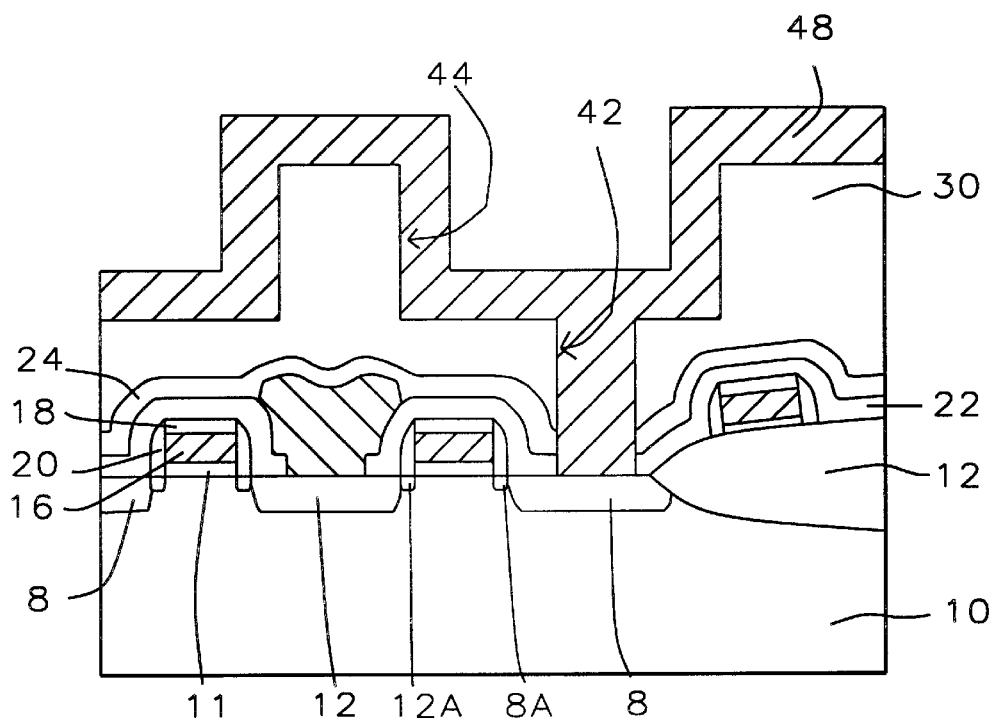

As shown in FIG. 3, a first conductive layer 48 is formed over the first insulating layer, in the tub hole 44, and in the contact hole 42 thereby forming an electrical contact with the source 8. The first conductive layer 48 has vertical sidewalls on the vertical sidewalls of the tub hole 44. The first conductive layer 48 is preferably formed of polysilicon doped with an impurity selected from the group consisting of: phosphorus, and arsenic; and has an impurity concentration in the range of between about 1E19 to 1E21 atoms/cm$^3$ and more preferably 1E20 atoms/cm$^3$. The first conductive layer has a thickness over the first insulation layer 30 in the range of between about 500 and 2000 Å and more preferably about 1000 Å. The first conductive layer of polysilicon can be deposited by LPCVD (low pressure chemical vapor deposition). This layer can be doped by ion implanting with phosphorous or arsenic ions at a dosage between about 5E15 and 2E16 atoms/sq-cm and an energy of between about 20 and 60 Kev., or is doped with phosphorus oxychloride (POCl$_3$) at a temperature of between about 875 and 900° C., for between about 30 and 50 minutes. The polysilicon layer may be doped in situ.

Figure 4:
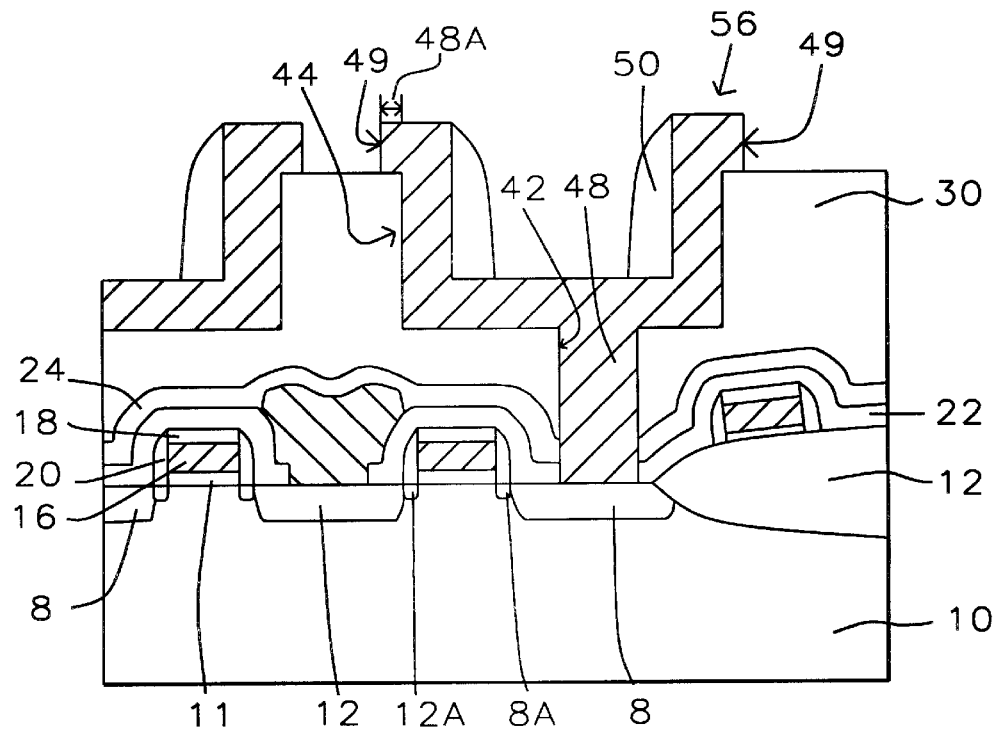

Referring to FIG. 4, insulating spacers 50 are formed over the vertical sidewalls of the first conductive layer 48. The spacers 50 have vertical sidewalls. The spacers 50 are preferably formed of silicon nitride, or silicon oxide, such as BPSG, BPTEOS, TEOS oxide. The spacers 50 preferably have a thickness in the range of between about 1000 and 3000 Å and more preferably about 2000 Å.

As shown in FIG. 4, the first conductive layer is patterned, after insulating spacers 50 are formed using conventional photo-etching techniques defining a storage electrode 56 aligned to the device area 8. The cylindrical storage electrode 56 has vertical sidewalls. The first conductive layer 48 is patterned preferably by forming a second photoresist layer over the first conductive layer. The second photoresist layer covers the active area and has a second opening over non-active areas. The first conductive layer is then etched through the second opening thereby defining the storage electrode and separating adjacent electrodes. The storage electrode 56 has a horizontal fin on the top surface of the first insulating layer. The horizontal fin 48A has outer vertical sidewalls 49. See FIG. 4.

Figure 5:
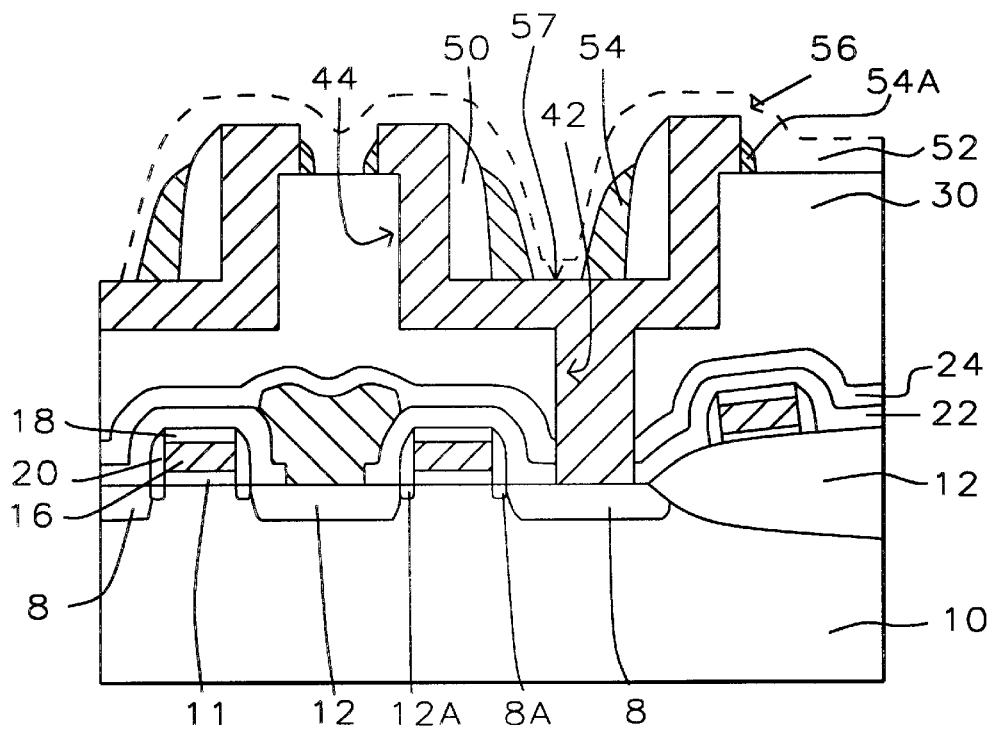

As shown in FIG. 5, a vertical inner wall 54 is formed on the vertical sidewalls of the spacers 50 exposing a central bottom portion 57 of the storage electrode. Also, outer spacers 54A of polysilicon are formed on the outer vertical sidewalls 49 of the horizontal fin 48A. The vertical inner wall 54 is created by forming a conductive layer 52 (shown in dashed lines) over the resultant surface. The conductive layer 52 is then anisotropically etched to form the vertical inner wall 54. The inner wall 54 (e.g., inner cylinder) preferably has a thickness in the range of between about 500 and 2500 Å and more preferably about 1000 Å. The inner wall 54 preferably has a height in the range of between about 1000 and 3000 Å; and more preferably about 2500 Å. The inner wall effectively increases the surface area and therefore capacitance by about 40% compared to a conventional single wall capacitor.

Figure 6:
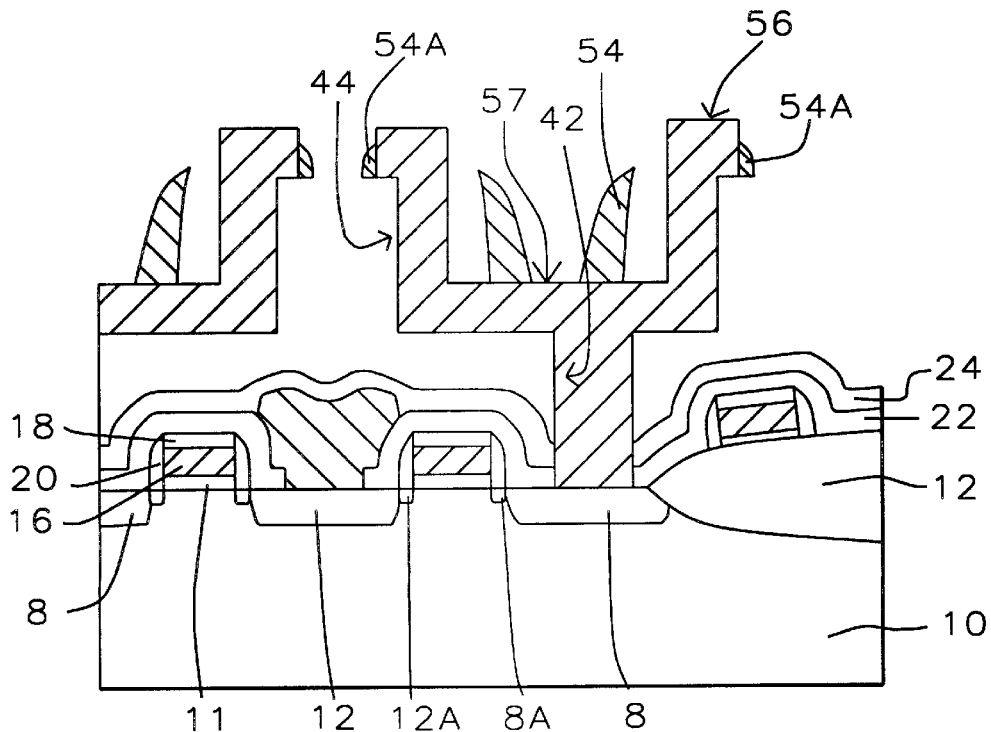

Referring to FIG. 6, the spacers 50 and the first insulating layer 30 are removed thereby forming the double wall tub shaped storage electrode 56. The spacers can be removed by a selective etch, such as a HF solution or a buffered HF wet oxide etch. The etch barrier layer 24 prevents the etch from removing underlying structures.

Figure 7:
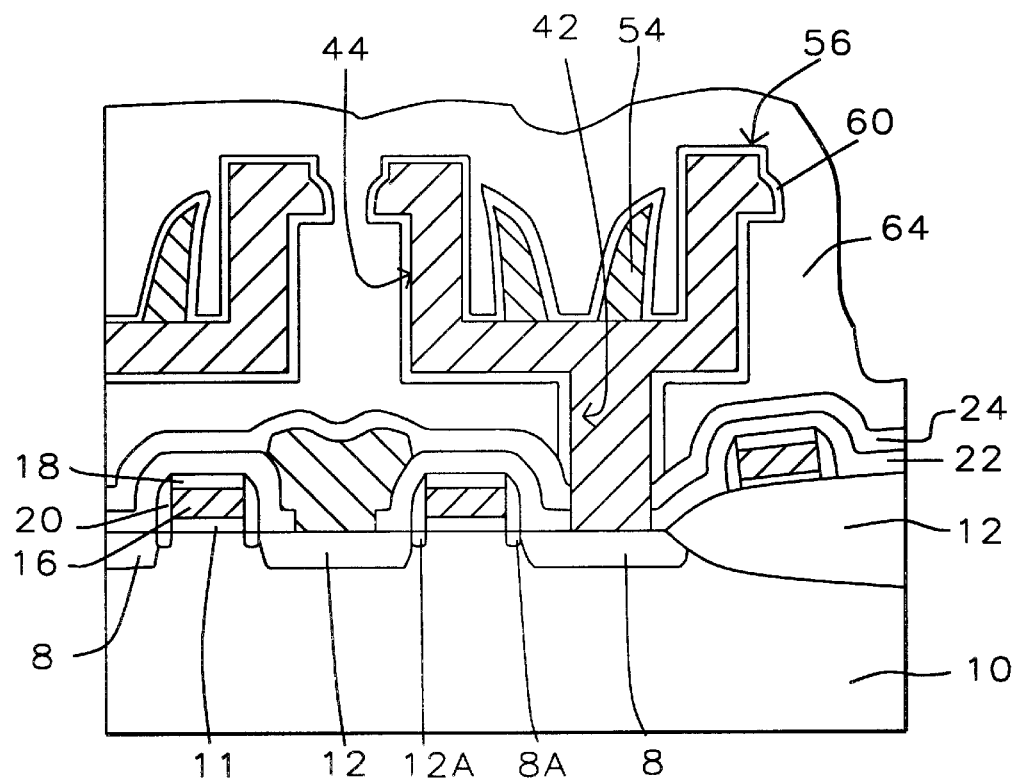

Turning to FIG. 7, a capacitor dielectric layer 60 is formed over the storage electrode 56. The material of the dielectric layer 60 can be any suitable materiel having a high dielectric constant and being continuous and pinhole free. The conformal dielectric layer 60 can be formed of silicon nitride, an oxide/nitride/oxide (ONO) film, an oxide/nitride(ON) film, tantalum pentoxide ($Ta_2O_5$) and silicon oxide material. Preferably, the conformal dielectric layer is formed of ONO. The conformal dielectric layer 60 preferably has at thickness in the range between about 40 and to 80 Å and more preferably about 55 Å.

A top electrode 64 is formed over the capacitor dielectric layer as shown in FIG. 7. This is accomplished by forming a conductive layer over the resultant surface. The top electrode 64 has a thickness in the range between about 2000 and 5000 Å and more preferably about 3000 Å. The top plate electrode is preferably formed with polycrystalline silicon doped with an impurity. The top plate electrode preferably has an impurity concentration in the range of between about 1E19 and 1E21 atoms/cm$^3$ and more preferably about 1E20 atoms/cm$^3$.

Figure 8:
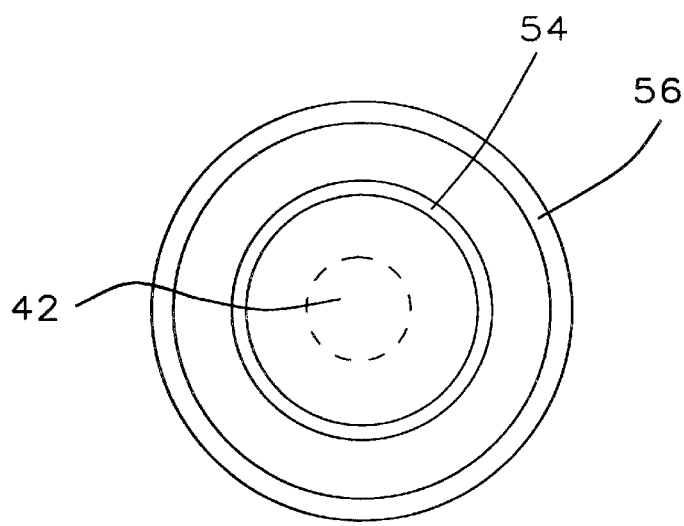
FIG. 8 is a schematic top plan view illustrating the double wall capacitor of the present invention.

FIG. 8 shows a top down view of the double wall cylindrical tub shaped capacitor of the present invention. The capacitor can have other shapes, such as rectangular, square, triangular, depending upon the application as is obvious to one skilled in the art.

Figure 9:
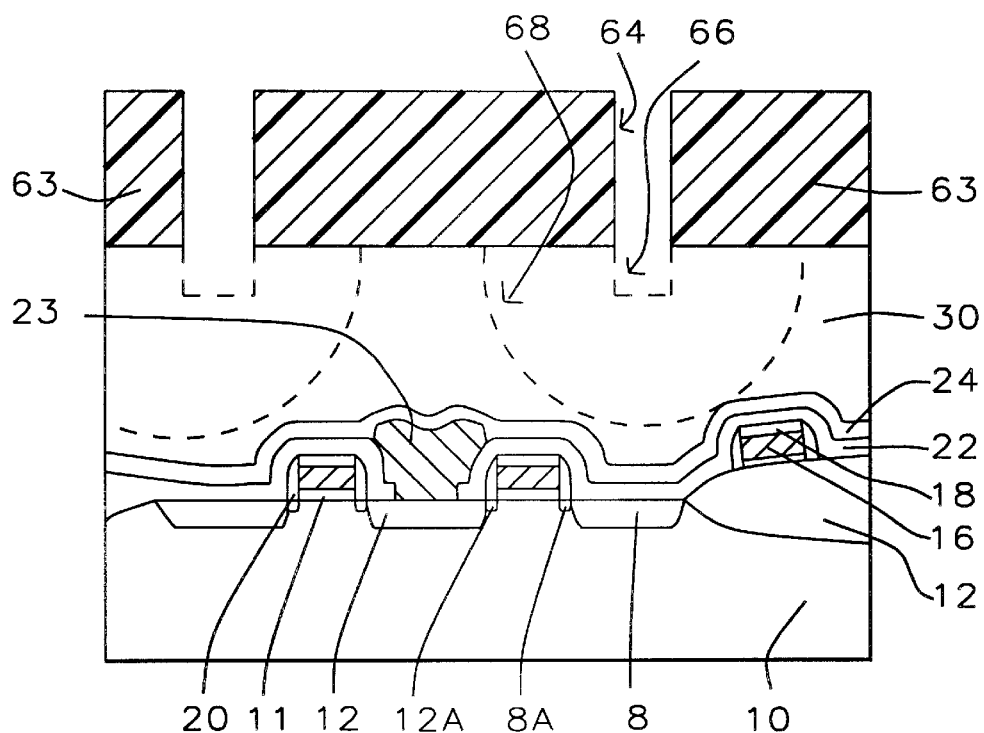
FIGS. 9 through 15 are cross sectional views for illustrating a second embodiment of the method for manufacturing a DRAM having a double wall cup shaped capacitor according to the present invention.

The second embodiment of the method is described below and is shown in FIGS. 9 through 15. As shown in FIG. 9, a silicon substrate is prepared using conventional process steps up to the point of defining the capacitor cell as describe above in the first embodiment. At this point, fabrication of word lines, associated active area and optional digit lines for a capacitor over digit line have been completed. A photoresist layer 63 having an opening 64 is formed over the first insulation layer 30. The opening is preferably circular or rectangular. A circular opening preferably has a diameter in the range of between about 0.25 and 0.7 μm and more preferably of about 0.5 μm.

FIG. 9 shows the first insulation layer 30 formed over the resultant surface. A first photoresist layer 63 having a first opening 64 over the source region 8 is formed over the first insulation layer 30. The first opening 64 preferably has a circular shape with a diameter in the range of between about 0.25 and 0.7 μm and more preferably about 0.5 μm. Alternately, the first opening 64 preferably has a rectangular shape with a length in the range of between about 0.5 and 0.8 μm and a width in the range between about 0.2 and 0.5 μm.

An optional anisotropic etch that forms a first hole 66 in the first insulating layer can be performed as shown in FIG. 9. The first insulation layer 30 is etched through the first opening 64 forming a first hole 66. The first hole 66 is used to change the etch profile 68 of the subsequent isotropic etch which forms the cup shaped hole 68. The etch is used to compensate for a thick first insulation layer relative to the space between capacitors and other elements. The first hole 66 preferably has a depth in the range of between about 4000 and 7000 Å and more preferably about 5000 Å.

Figure 10:
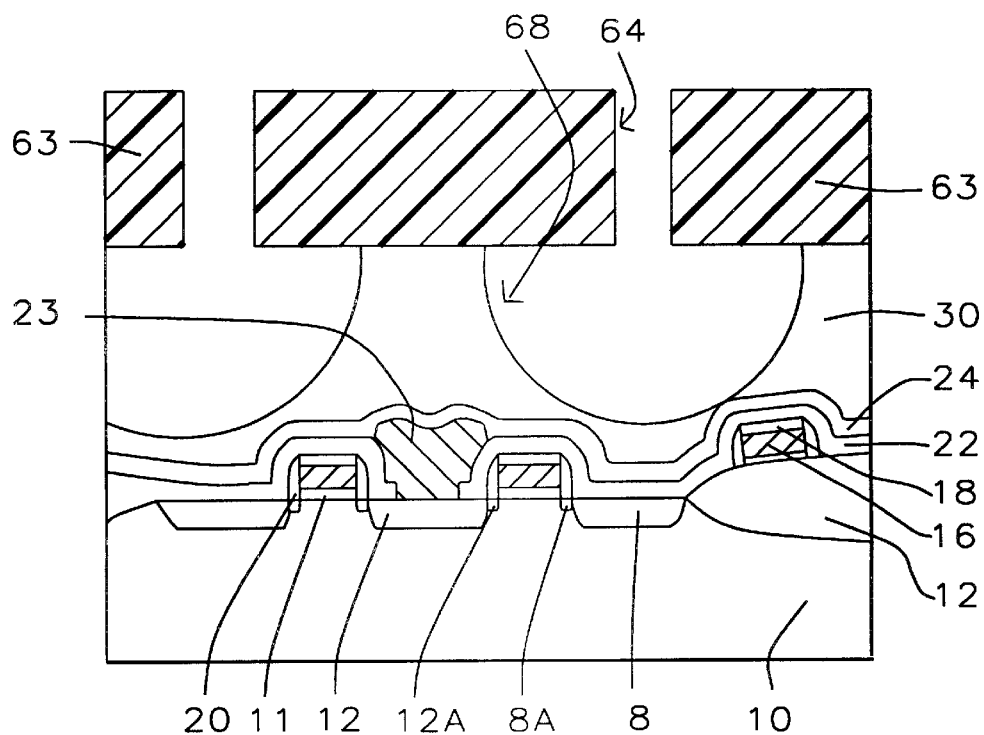

Turning to FIG. 10, the first insulation layer 30 is isotropically etched through the first opening 64 forming a cup shaped hole 68. The cup shaped hole 68 has a hemispherical shape because of the equal isotropic etch. The isotropic etch is preferably performed with HF, or BOE (buffered oxide etch) wet etch. The isotropic etch preferably removes a thickness (radius) of the first insulating layer of between about 1000 and 5000 Å and more preferably about 3000 Å.

Figure 11:
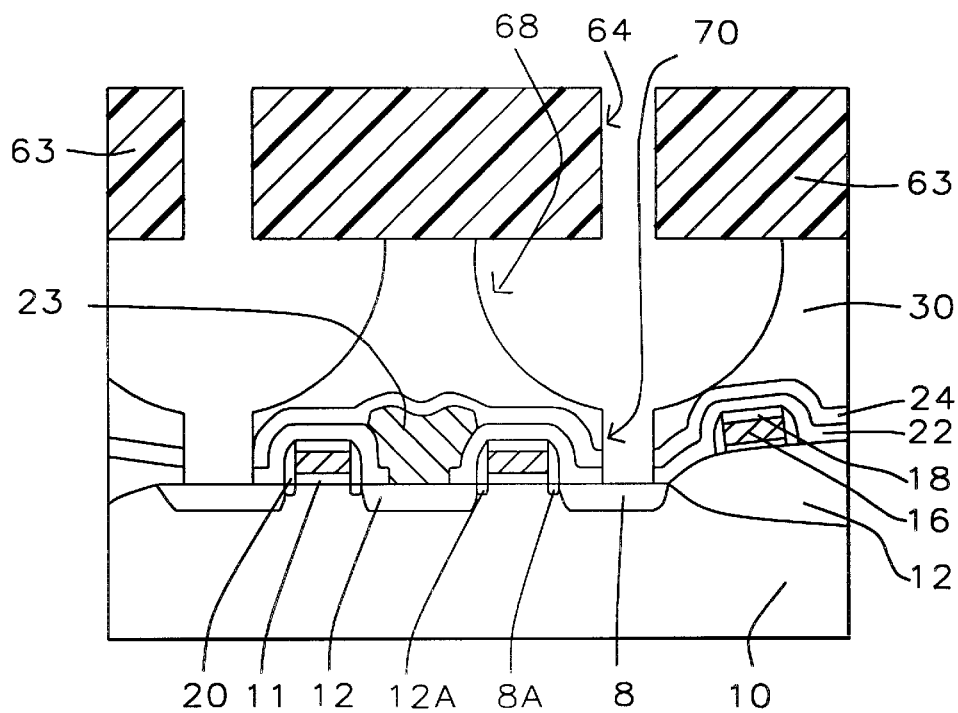

As shown in FIG. 11, the first insulating layer 30 is anisotropically etched through the first opening forming a contact hole 70 to partially expose the source 8. The contact hole 70 is preferably circular or rectangular. A circular hole 70 preferably has a diameter in the range of between about 0.25 and 0.7 μm. The photoresist layer 63 is then removed.

Figure 12:
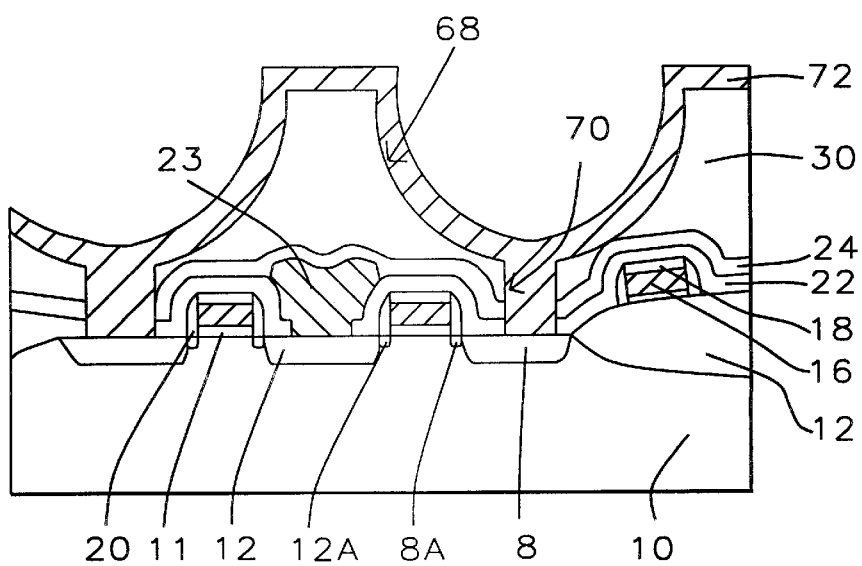

Referring to FIG. 12, a first conductive layer 72 is formed over the first insulating layer, in the cup shaped hole 68 and in the contact hole 70 thereby forming an electrical contact with the source 8. The first conductive layer 72 has curved sidewalls on the curved sidewalls of the cup hole. The first conductive layer 72 is preferably formed of doped polysilicon preferably having a thickness in the range of between about 500 and 2000 Å.

Figure 13:
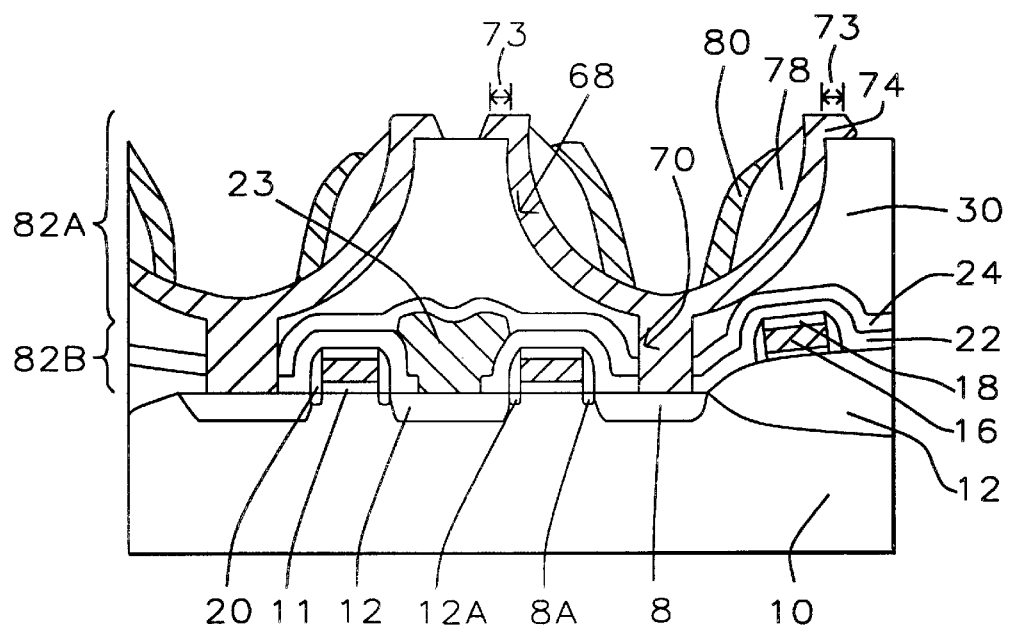

As shown in FIG. 13, spacers 78 are formed over the curved sidewalls of the first conductive layer 72. The spacers 78 preferably have a thickness in the range of between about 1000 and 3000 Å and are preferably formed of silicon oxide. Spacers 78 are preferably formed as described above in the first embodiment. An insulating layer is formed over the resultant surface and is anisotropically etched back to form the spacers 78.

As shown in FIG. 13, the first conductive layer 72 is patterned after spacers 78 are formed using conventional photo and etching techniques to define the cup shaped electrode 74 which is aligned to the device area 8. A photoresist mask is formed over the active areas (e.g., areas where the electrodes are formed). The areas between the electrodes are exposed through an opening in the mask. The exposed conductive layer is etched away thus electrically isolating adjacent electrodes. The patterning defines a cup shaped electrode having a lower portion 82B and a cup outer wall 82A. See FIG. 17. The cup shaped outer wall 82A has a horizontal fin 73 over said top surface of the first insulating layer 30.

Figure 14:
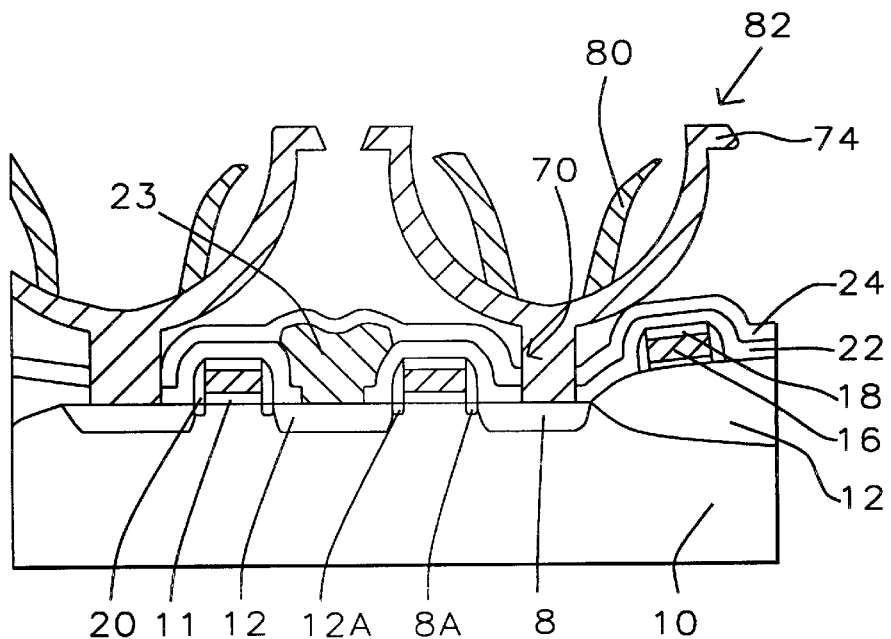

Vertical inner walls 80 (i.e., inner cylinder) are then formed on the sidewalls of the spacers 78 exposing a central bottom portion 81 of the cup shaped outer wall 82A. The inner walls 80 are preferably formed as described in the first embodiment (e.g., where a second polysilicon layer is formed and anisotropically etched back). The spacers 78 and the first insulation layer 30 are then removed thereby forming the double wall cup shaped storage electrode 74 as shown in FIG. 14. The spacers can be removed by a selective etch, such as a HF solution or a buffered HF wet oxide etch. The etch barrier layer 24 prevents the etch from removing underlying structures.

Figure 15:
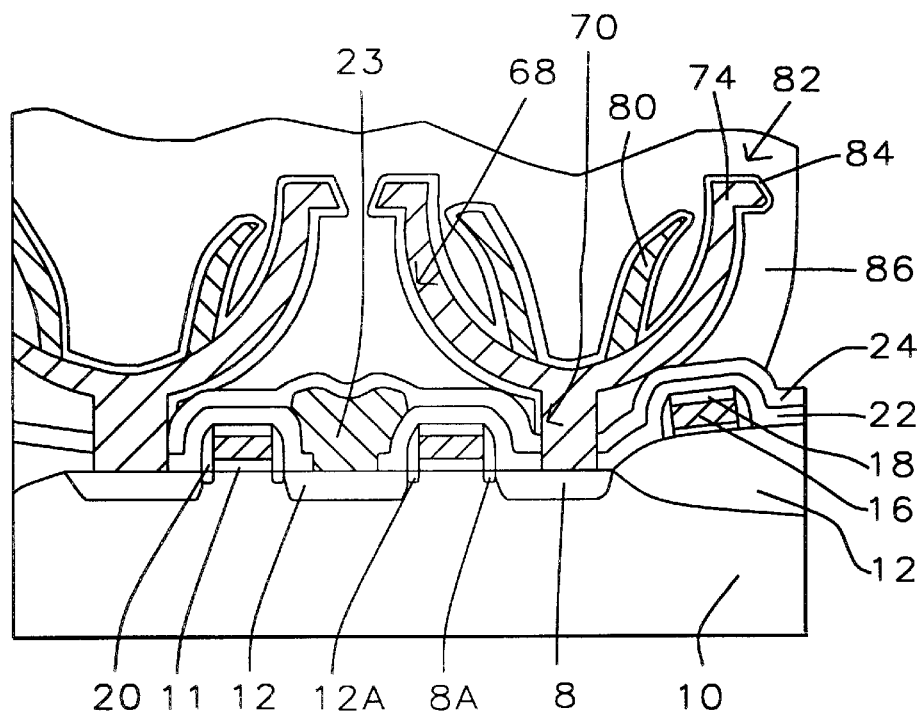

Turning to FIG. 15, a capacitor dielectric layer 84 and a top electrode 86 are sequentially formed over the at least double wall cup shaped storage electrode 74 thereby forming a double wall cup shaped capacitor. The dielectric 60 and top electrode are formed as describe above in the first embodiment.

The structure of the double wall tub and cup shaped capacitor for a DRAM cell on a semiconductor substrate can be described as follows. See FIGS. 7 and 16 for the tub shaped capacitor and FIGS. 15 and 17 for the cup shaped capacitor. The semiconductor substrate has a MOS transistor with a source region and a drain region. The storage electrode in the first and second embodiments. has an upright pedestal 56C 82B and a tub structured upper portion 56A 56B 54 (82A 80). The upright pedestal is in electrical contact with a source region in a substrate. The tub structured upper portion is positioned over the upright pedestal. The tub structured upper portion has a concentric upright inner wall 54 (80) and a concentric outer wall 56A (82A). A capacitor dielectric layer 60 84 and a top electrode 64 86 cover the tub structured upper portion. See FIGS. 7 and 15.

Figure 16:
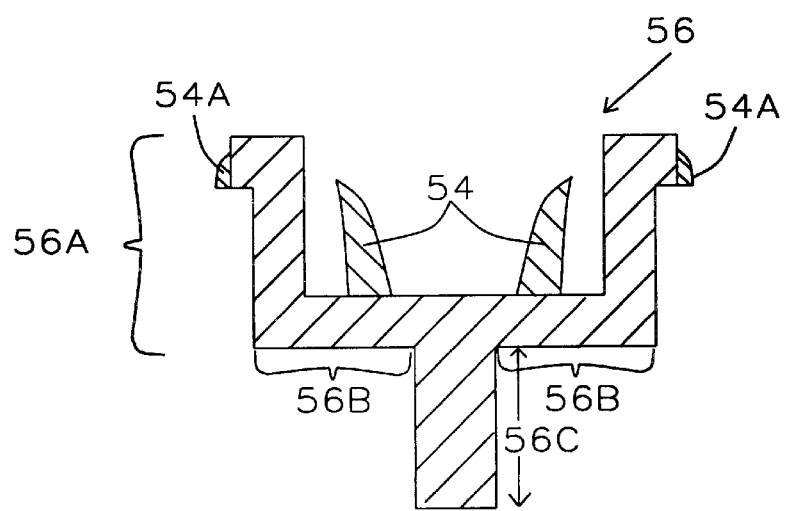
FIG. 16 shows the structure of the first embodiment of the double wall tub structured capacitor of the present invention.

The first embodiment, in which the capacitor 56 has a square shaped cylindrical outer wall 56A 56B, is shown in FIG. 16. The outer wall 56A 56B of the tub shaped upper portion has a lower horizontal extension 56B and an outer vertical wall 56A. The lower horizontal portion 56B and the outer vertical wall 56A form about a 90° angle. The lower horizontal extension 56B preferably has a length in the range of between about 0.3 and 0.7 µm and the outer vertical wall 56A preferably has a height in the range of between about 2000 and 8000 Å. The lower portion 56C preferably has a height in the range of between about 2000 and 8000 Å. The inner wall 54 preferably has a height in the range of between about 1000 and 5000 Å. The storage electrode preferably has an overall height in the range of between about 4000 and 15,000 Å. The storage electrode is preferably formed of polysilicon doped with an impurity concentration in the range of between about 1E19 and 1E21 atoms/cm$^3$.

Figure 17:
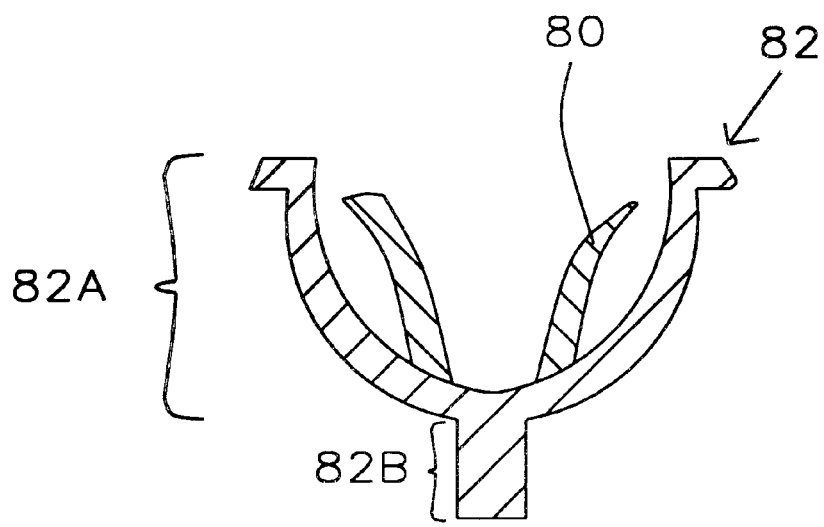
FIG. 17 shows the structure of the second embodiment of the double wall cup shaped capacitor of the present invention.

The second embodiment, in which the outer wall 82A is cup shaped is shown in FIG. 17. The lower portion 82B preferably has a diameter in the range of between about 0.25 and 0.7 µm and a height in the range of between about 2000 and 8000 Å. The inner wall 80 preferably has a height in the range of between about 1000 and 3000 Å. The storage electrode preferably has an overall height in the range of between about 4000 and 15,000 Å. The storage electrode is preferably formed of polysilicon doped with an impurity concentration in the range of between about 1E19 and 1E21 atoms/cm$^3$.

The novel processes of this invention produce a double wall cup shaped capacitor which requires less masking and etch steps than conventional processes. The second embodiment (FIGS. 9–15) of the invention uses one masking step to define both the contact node and the storage electrode (e.g., it eliminates at least one mask step) thereby making the process cheaper and increasing yields. Also the process is self aligning for the node contact thereby provides additional accuracy and miniaturization.

It should be will understood by one skilled in the art that by including additional process steps not described in this embodiment, other types of devices can also be included on the DRAM chip. For example, N wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips. It should be also understood that the figures depict only one DRAM storage cell out of a multitude of cells that are fabricated simultaneously on the substrate.

While the invention has been particularly shown and described with reference to the preferred embodiments thereof, it will be understood by those skilled in the art that various changes in form and details may be made without departing from the spirit and scope of the invention.

What is claimed is:

1. A double wall capacitor having a horizontal fin for a DRAM cell on a substrate; said substrate having a MOS transistor with a source region and a drain region; comprising:

a storage electrode having an upright pedestal and an upper portion;

said upright pedestal in electrical contact with a source region in a substrate;

said upper portion positioned over said upright pedestal; said upper portion having an outer wall and a concentric inner wall attached to said outer wall;

said outer wall of said upper portion has a lower horizontal portion and an outer vertical wall; said lower horizontal portion and said outer vertical wall join at about a 90° angle; said concentric inner wall is a vertical cylinder;

said outer vertical wall having a horizontal fin, said horizontal fin having outer vertical sidewalls; outer spacers on said outer vertical sidewalls of said horizontal fin; and a capacitor dielectric layer and a top electrode covering said upper portion.

2. The double wall capacitor of claim 1 wherein said lower horizontal portion has a length in the range of between about 0.3 and 0.7 µm and said outer vertical wall preferably has a height in the range of between about 2000 and 8000 Å.

3. The double wall capacitor of claim 1 wherein said inner vertical wall has a height in the range of between about 1000 and 5000 Å.

4. The double wall capacitor of claim 1 wherein said upright pedestal is cylindrical shaped and has a diameter in the range of between about 0.25 and 0.7 µm and a height in the range of between about 2000 and 8000 Å.

5. The double wall capacitor of claim 1 wherein said storage electrode has an overall height in the range of between about 4000 and 15,000 Å.

6. A double wall capacitor having a horizontal fin for a DRAM cell on a substrate; said substrate having a MOS transistor with a source region and a drain region; comprising:

a storage electrode having an upright pedestal and an upper portion;

said upright pedestal in electrical contact with a source region in a substrate;

said upper portion positioned over said upright pedestal; said upper portion having an outer wall and a concentric inner wall attached to said outer wall; said concentric inner vertical wall has a height in the range of between about 1000 and 5000 Å;

said outer wall of said upper portion has a lower horizontal portion and an outer vertical wall; said lower horizontal portion and said outer vertical wall join at about a 90° angle; said concentric inner wall is a vertical cylinder;

said lower horizontal portion has a length in the range of between about 0.3 and 0.7 µm, and said outer vertical wall preferably has a height in the range of between about 2000 and 8000 Å;

said outer vertical wall having a horizontal fin, said horizontal fin having outer vertical sidewalls;

outer spacers on said outer vertical sidewalls of said horizontal fin; said storage electrode has an overall height in the range of between about 4000 and 15,000 Å; and a capacitor dielectric layer and a top electrode covering said upper portion.

7. The double wall capacitor of claim 6 wherein said upright pedestal is cylindrical shaped and has a diameter in the range of between about 0.25 and 0.7 μm and a height in the range of between about 2000 and 8000 Å.

8. A capacitor having a double wall cup shaped storage electrode for a memory device on a substrate; said substrate having a MOS transistor with a source region and a drain region; comprising:

said storage electrode having a lower portion, a cup shaped outer wall, and a vertical inner wall; a central bottom portion of said cup shaped outer wall is not covered by said vertical inner wall;

said cup shaped outer wall having a horizontal fin;

said lower portion in electrical contact with a source region in said substrate; said lower portion has a diameter in the range of between about 0.25 and 0.7 μm and a height in the range of between about 2000 and 8000 Å;

said cup shaped outer wall positioned over said lower portion;

said cup shaped outer wall is hemispherical shaped, and said vertical inner wall is a vertical cylinder; and a capacitor dielectric layer and a top electrode covering said cup shaped outer wall, and said vertical inner wall.

9. A capacitor having a double wall cup shaped storage electrode for a memory device on a substrate; said substrate having a MOS transistor with a source region and a drain region; comprising:

said storage electrode having a lower portion, a cup shaped outer wall, an inner vertical wall; a central bottom portion of said cup shaped outer wall is not covered by said vertical inner wall;

said cup shaped outer wall having a horizontal fin;

said lower portion in electrical contact with a source region in said substrate; said lower portion has a diameter in the range of between about 0.25 and 0.7 μm and a height in the range of between about 2000 and 8000 Å;

said cup shaped outer wall positioned over said lower portion;

said cup shaped outer wall is hemispherical shaped, and said vertical inner wall is a vertical cylinder;

said storage electrode has an overall height in the range of between about 4000 and 15,000 Å; and a capacitor dielectric layer and a top electrode covering said cup shaped outer wall and said vertical inner wall.

10. A capacitor having a double wall cup shaped storage electrode for a memory device on a substrate; said substrate having a MOS transistor with a source region and a drain region; comprising:

said storage electrode having a lower portion, a cup shaped outer wall, and a vertical inner wall; a central bottom portion of said cup shaped outer wall is not covered by said vertical inner wall;

said cup shaped outer wall having a horizontal fin;

said lower portion in electrical contact with a source region in said substrate;

said cup shaped outer wall positioned over said lower portion;

said cup shaped outer wall is hemispherical shaped, and said vertical inner wall is a vertical cylinder; and a capacitor dielectric layer and a top electrode covering said cup shaped outer wall, and said vertical inner wall; and said vertical inner wall has a height in the range of between about 1000 and 3000 Å; and said storage electrode has an overall height in the range of between about 4000 and 15,000 zÅ.

* * * * *